United States Patent
Lee et al.

(10) Patent No.: US 7,099,785 B2
(45) Date of Patent: Aug. 29, 2006

(54) ELECTRIC PLUG HAVING DISPLAY MEANS TO INDICATE CONSUMED POWER AND ELECTRIC ENERGY

(75) Inventors: Cheng-Liang Lee, Hsi Chih (TW); Chien-Chih Chen, Hsi Chih (TW); Li-Hung Kuo, Taipei Hsien (TW)

(73) Assignee: Joseph Technology Co., Ltd., Hsi Chih City (TW)

( * ) Notice: Subject to any disclaimer, the term of this patent is extended or adjusted under 35 U.S.C. 154(b) by 0 days.

(21) Appl. No.: 11/161,056

(22) Filed: Jul. 21, 2005

(65) Prior Publication Data

US 2006/0036380 A1 Feb. 16, 2006

(30) Foreign Application Priority Data

Jul. 28, 2004 (CN) .................... 2004 2 0844469

(51) Int. Cl.
G01R 15/00 (2006.01)
(52) U.S. Cl. ....................................................... 702/57
(58) Field of Classification Search ................... 702/57
See application file for complete search history.

(56) References Cited

U.S. PATENT DOCUMENTS 7,043,380 B1 * 5/2006 Rodenberg et al. ........... 702/62
2005/0212526 A1 * 9/2005 Blades ....................... 324/543

* cited by examiner

*Primary Examiner*—Michael Nghiem
*Assistant Examiner*—Demetrius R. Pretlow
(74) *Attorney, Agent, or Firm*—Pai Patent & Trademark Law Firm; Chao-Chang David Pai

(57) ABSTRACT

An electric plug is disclosed which includes a detection circuit, which detects electric current and voltage and removes high frequency noises from power supply; an electric energy measuring and converting circuit, which receives detected signal from the detection circuit and outputs a corresponding electric energy signal; a microprocessor, which proceeds with electric energy signal processing, time counting and data storing processes according to the electric energy signal received from the electric energy measuring and converting circuit; a DC power supply circuit, which provides the necessary working voltage to the electric energy measuring and converting circuit and the microprocessor; and an LCD circuit, which displays electric energy and time data.

6 Claims, 4 Drawing Sheets

ELECTRIC PLUG HAVING DISPLAY MEANS TO INDICATE CONSUMED POWER AND ELECTRIC ENERGY

BACKGROUND OF THE INVENTION (a) Field of the Invention

The present invention relates to electric plugs and more particularly to an electric plug having display means to indicate consumed power and electric energy. The invention has power and electric energy detection and measuring circuits and a LCD digitalized and incorporated into a small electric plug with two operation buttons provided outside the housing of the electric plug for operation. Through the use of the electric plug in an electric appliance, the user can conveniently monitor the consumed power and electric energy and other related data.

(b) Description of the Prior Art

Current commercial power or electric energy measuring instruments such as electric meter, watt-hour meter, etc., commonly have a big housing that cannot be installed in an electric plug. Therefore, it is difficult to monitor the consumed power and accumulative consumption of electric energy of an electric appliance. When wishing to know the consumed power or accumulative consumption of electric energy of an electric appliance, an expensive electric meter or watt-hour meter would have to be used.

SUMMARY OF THE INVENTION

The present invention has been accomplished under the circumstances in view. It is the main object of the present invention to provide an electric plug having display means to indicate consumed power and electric energy, which has a simple structure and small size for convenient use in any of a variety of electric appliances to display power and electric energy data for energy management applications such as fee counting, power saving control, power safety and efficiency control.

It is another object of the present invention to provide a high-safety electric plug, which has a temperature detection circuit to detect the presence of an overheat and to drive a backlight to flash or a display to produce a visual warning signal upon detection of an overheat.

It is still another object of the present invention to provide an electric plug which employs a microprocessor data storage and classification technology to provide the user with electric consumption information, such as time of use, accumulative time of abnormality, accumulative time of electric connection, short-term and total accumulative amount of consumed power, etc., for analysis and management.

DETAILED DESCRIPTION OF THE PREFERRED EMBODIMENTS

Figure 1:
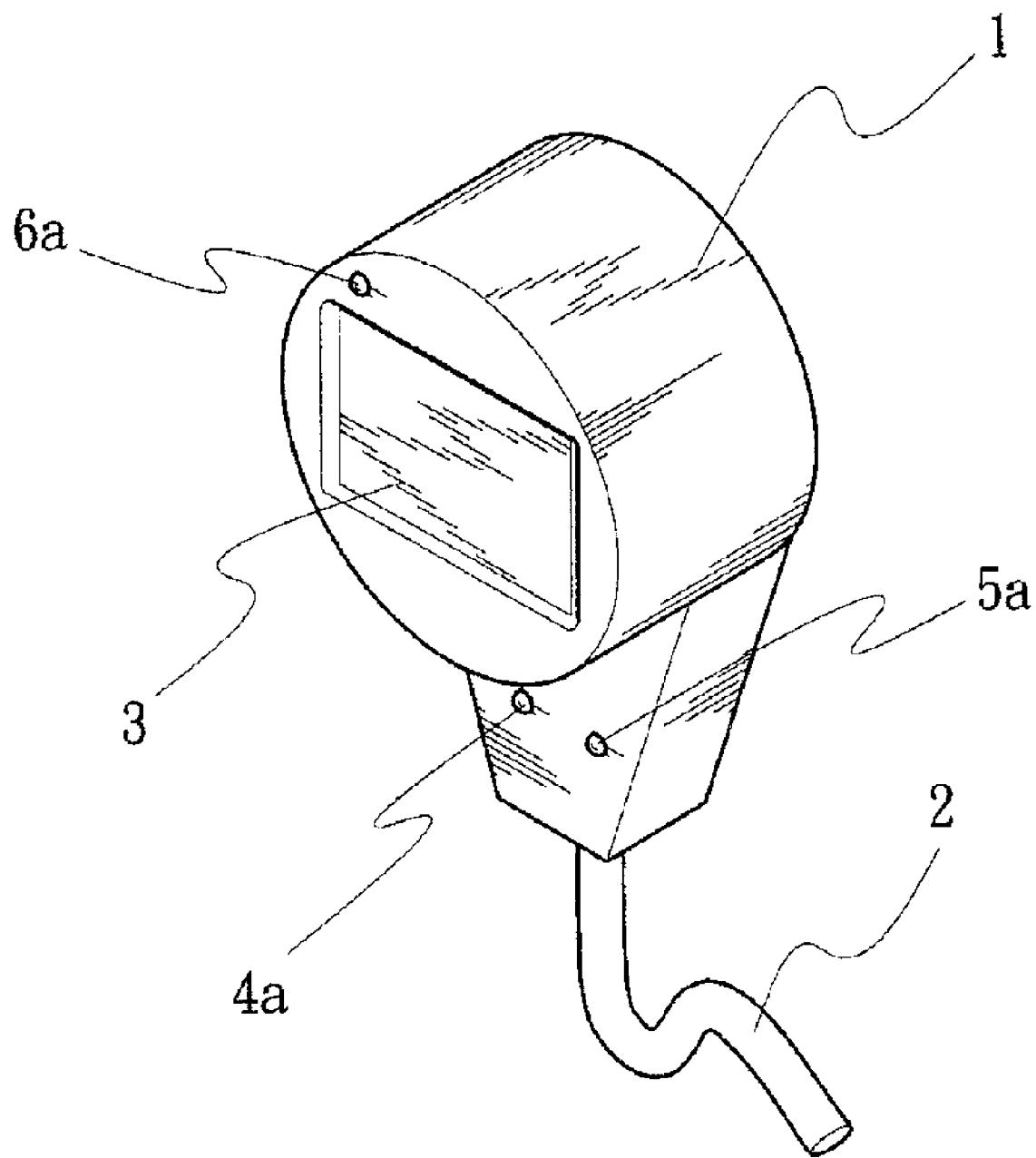
FIG. 1 is a perspective view of an electric plug according to the present invention.

Referring to FIG. 1, an electric plug having display means to indicate consumed power and electric energy in accordance with the present invention is shown for use in an electric appliance or to substitute for a power cable for electric appliance. When the electrodes of the electric plug are connected to power supply, the display means of the electric plug immediately displays the consumed power and the value of accumulative electric energy for further energy management applications, for example, fee calculation, improvement on the efficiency of use of electricity.

Figure 2:
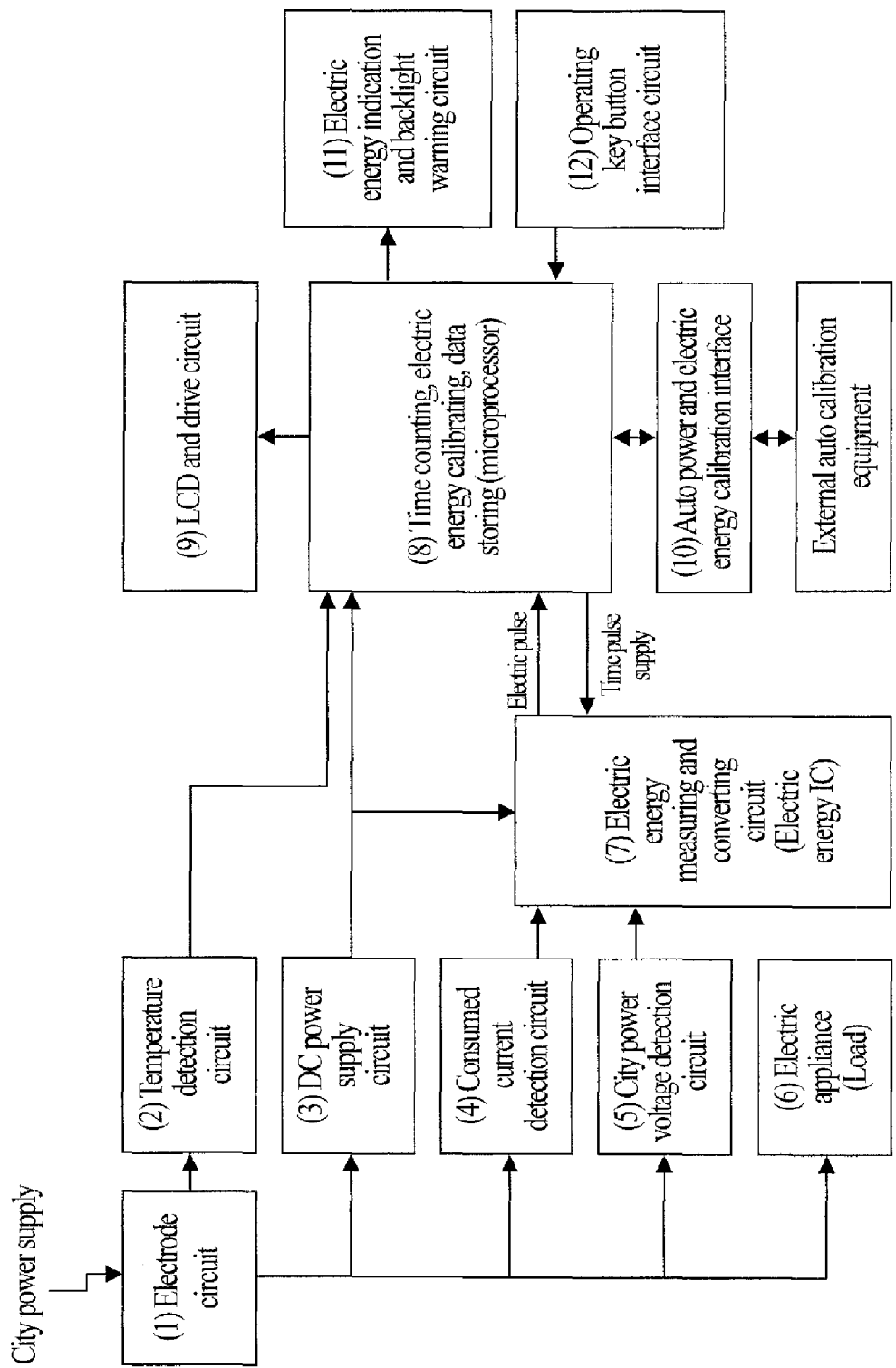
FIG. 2 is a system block diagram of the present invention.

Referring to FIG. 2, the electric plug comprises an electrode circuit and a housing. The housing houses a detection circuit, an electric energy measuring and converting circuit, a DC power supply circuit, a microprocessor, and a liquid crystal display circuit. The detection circuit detects electric current and voltage, and removes high frequency noises from the power supply. The electric energy measuring and converting circuit receives detected signal and outputs a corresponding electric energy signal to the microprocessor. The DC power supply circuit provides the necessary working voltage to the electric energy measuring and converting circuit and the microprocessor. The microprocessor proceeds with electric energy signal processing, time counting, and data storing processes according to the signal received. The LCD circuit displays electric energy and time data. The input end of the electrode circuit is electrically connected to a power supply. The output end of the electrode circuit is electrically connected to the input end of the detection circuit. Output signal from the output end of the detection circuit is sent to the input end of the microprocessor. Processed time signal from the microprocessor is sent to the electric energy measuring and converting circuit. The output end of the microprocessor is electrically connected to the LCD circuit. The input end of the DC power supply circuit is electrically connected to the electrode circuit. The first output end of the DC power supply circuit is electrically connected to the electric energy measuring and converting circuit. The second output end of the DC power supply circuit is electrically connected to the microprocessor.

Figure 3:
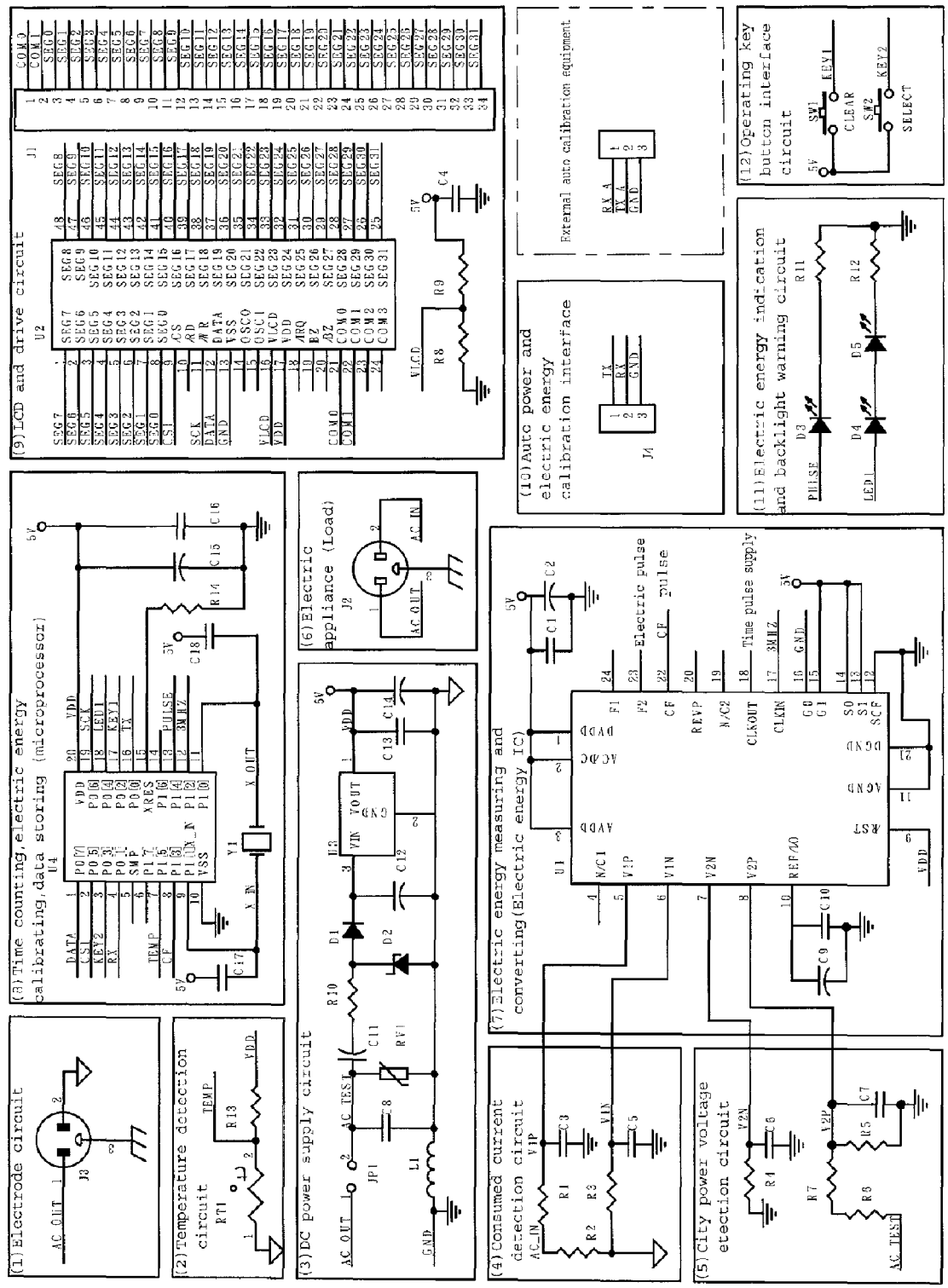
FIG. 3 is a circuit diagram of the present invention.
Figure 4:
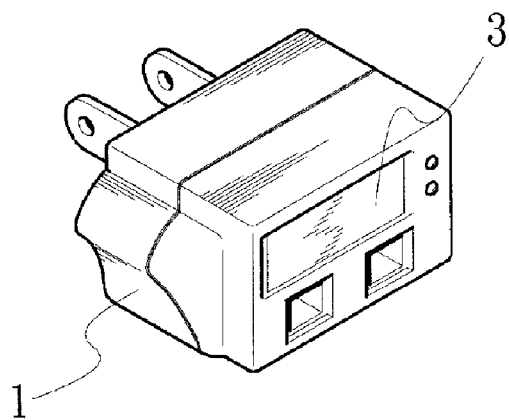
FIG. 4 shows another embodiment of the present invention.
Figure 5:
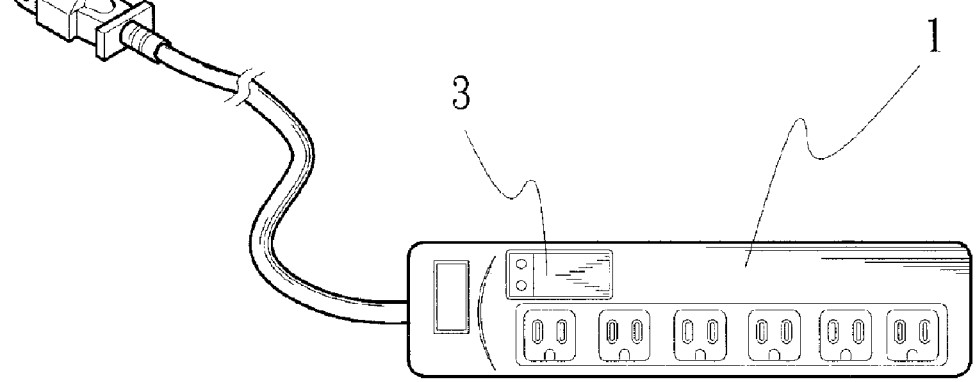
FIG. 5 shows yet another embodiment of the present invention.
Figure 6:
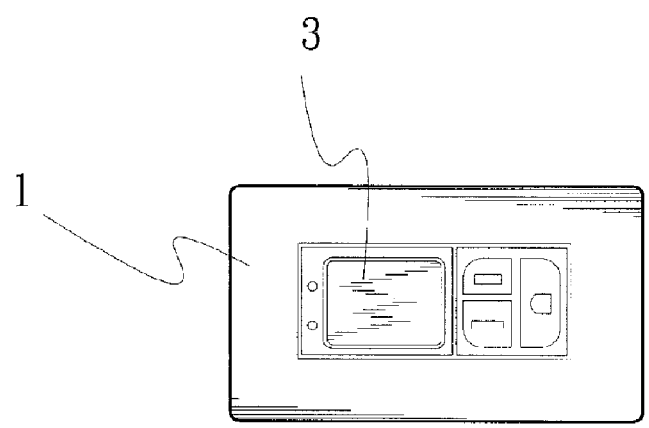
FIG. 6 shows yet another embodiment of the present invention.

Referring to FIG. 3, the electrode circuit J3 comprises a positive electrode J3-1 and a negative electrode J3-2 electrically connected between the power supply and the detection circuit. The detection circuit comprises a consumed current detection circuit and a power voltage detection circuit connected in parallel. The consumed current detection circuit is comprised of resistor R2, resistor R1, resistor R3, capacitor C3, and capacitor C5. Resistor R3 is a current detection resistor having a good temperature coefficient (20 ppm/° C.) and low resistance value (1.0 mΩ) and using 1 W. The consumed current detection circuit has a small size. At 20 A, the voltage drop is 0.02V, and the consumed power is 0.4 W. Resistor R1 and capacitor C3 form a low-pass filter. Resistor R3 and capacitor C5 form another low-pass filter. The two low-pass filters remove high frequency noises from the power supply. When consumed current passes through the filters to the electric energy measuring and converting circuit (electric energy IC), the direct ratio between the voltage at the two ends of resistor R2 is used for electric energy calculation.

The power voltage detection circuit, as shown in FIG. 3, is comprised of resistor R6, resistor R7, resistor R5, resistor R4, capacitor C6, and capacitor C7. Resistors R6 and R7 are 150K precision resistors. Resistor R5 is a 1K precision resistor. When input voltage is 120V, the voltage drop across resistor R5 is 0.4V. Power voltage passes through capacitor C7, resistor R4 and capacitor C6 to the electric energy measuring and converting circuit (electric energy IC) for electric energy calculation. When passing through capacitor C7, resistor R4 and capacitor C6, high frequency noises are removed from the power voltage.

In order to prevent burning of the electric plug due to overheat, a temperature detection circuit is electrically connected between the electrode circuit and the input end of the microprocessor. The temperature detection circuit comprises a series of resistors including at least one thermistor. The temperature detection circuit detects the voltage at the connection point between two thermistors (or one thermistor and one resistor) and determines the temperature level according to the detected voltage level, and then sends the detected temperature signal to the microprocessor, which in turn processes the temperature signal and drives the LCD circuit to give a warning signal when the temperature level of the temperature signal surpasses a predetermined range. As shown in FIG. 3, the temperature detection circuit comprises resistor RT1 and resistor R13. Resistor RT1 is a thermistor electrically connected to electrode J3-2 and electric current detection resistor R2. By means of heat conduction through the copper foil at the substrate, the temperature detection circuit detects the temperature at electrode J3-2 and the temperature at electric current detection resistor R2. The higher the temperature is, the lower the impedance value of resistor RT1 will be. When the temperature at the connection point TEMP between resistor RT1 and resistor R13 is increased, the voltage at TEMP is relatively lowered. When the microprocessor U4 detects the voltage at the connection point between resistor RT1 and resistor R13 to be below a predetermined value, it is judged to have an overheat. According to the present preferred embodiment, when voltage at TEMP drops below 1.8V, the temperature surpasses 50° C., and the LCD circuit gives an overheat warning signal, for example, a flashing light. When there exists overcurrent or improper connection of the electrode circuit, the temperature at resistor RT1 will increase quickly, and the microprocessor U4 will detect the situation and give an overheat warning message, and will also record the time of this unsafe condition.

According to the present invention, a warning signal will be produced for any abnormal electric energy signal during the use of the electric plug. The output end of the microprocessor is electrically connected to an electric energy indication and backlight warning circuit. The electric energy indication and backlight warning circuit provides a backlight and gives an electric energy indication according to the outputted signal from the microprocessor.

As shown in FIG. 3, D3 is an electric energy indication LED (light emitting diode); R11 is a current-limiting resistor; D4 and D5 are backlight LEDs (light emitting diodes); R12 is a current-limiting resistor. PULSE from the microprocessor drives D3 (electric energy indication LED) to flash. One flash of D3 represents 1 Wh. Simulating a real charge counting wheel, 5% for LED on and 95% for LED off during each flashing cycle, i.e., pulse width has 5% for HIGH and 95% for LOW. In an example where D3 flashes once each time pulse value 5999 is counted, pulse is HIGH and D3 is "on" during the pulse period of the first 300 pulses, and pulse is LOW and D3 is "off" during the pulse period of the remaining 5699 (5999−300=5699) pulses. When U4 counts the energy of 1 Wh, it adds 1 to the memory, and the pulse signal is changed from LOW to HIGH to turn on LED D3 once.

For easy operation, an operating key button interface circuit is provided on the outside of the housing. The operating key button interface circuit comprises a clear button and a select button. Clear button 4a is to clear the short-term accumulative amount of electric energy and the related electric records. The select button 5a is to alternate the display of all related data on the LCD 3. As shown in FIG. 3, SW1 is the clear button, and SW2 is the select button. When clear button SW1 is clicked, the short-term accumulative data is zeroed, for example, short-term accumulative amount of electric energy is zeroed, short-term electric power using time is zeroed. When select button SW2 is clicked, a next data is displayed on the LCD 3. The display data includes current power, short-term accumulative amount of electric energy, total accumulative amount of electric energy, short-term time of power connection, short-term safety time in use of electric power, short-term unsafety time in use of electric power, total time of power connection, total electric power using time, etc. The so-called "short-term" here refers to the accumulative value started from the last clicking of the clear button SW1 till the present time. The so-called "total" here refers to the accumulative value from the very beginning when electric power was first used. All "total" data is not clearable by the clear button. The recorded short-term and total data will not disappear due to failure of power supply.

D4 or D5 will be turned on each time the button is operated, thereby causing the LCD to produce a backlight, enabling people to see the display content of the LCD. When giving a warning message, D4 and D5 are quickly turned on and off to produce a flashing backlight. The electric energy indicator light 6a flashes once each time 1 Wh electric energy is consumed. The more the amount of electric power is consumed, the quicker the flashing frequency of the electric energy indicator light 6a will be. The electric energy indicator light 6a can also be used to calibrate the accuracy of the electric plug. Further, the microprocessor may control the LCD 3 to display different signs for different indications. For example, the sign of Smiling Face may be the safety sign indicating that the current power and temperature are within the safety range; the sign of Crying Face may be the unsafety sign indicating that the current power and temperature are beyond the safety range, and then a flashing backlight follows to give a visual warning signal.

The LCD circuit of the electric plug can be embodied using modern technology, for example, it comprises IC chip U2 and shunt resistors R8 and R9. The shunt voltage is provided for the working of the LCD, and the value (bias voltage) allows good contrast for the working of the LCD. IC chip U2 is the LCD drive IC. The LCD display content is provided by the microprocessor U4 through signals SCK and DATA, i.e., the microprocessor U4 sends data to the display memory of IC chip U2, enabling the IC chip U2 to drive the LCD through pin SEG and pin COM so that the data is displayed. According to the present preferred embodiment, the display is a 5 bit digital display that indicates current consumed power, unit: W (turned on at W point), range: 1 W~99999 W; accumulative electric energy value, unit: KWh (turn on at (degree) KWh), range 1 KWh~99999 KWh; TOTAL, for example: T KWh indicates the total accumulative amount of consumed electric energy from the beginning of the use of the electric appliance till the present time, and so on.

According to the present invention, in the DC power supply circuit as shown in FIG. 3, capacitor C8 and resistor RV1 form a noise suppression circuit; capacitor C11 and resistor R10 are to obtain 12V from Zener diode D2 by means of dropping the voltage at the power circuit, and diode D1 stores 12V DC current in capacitor C12. Voltage stabilizer IC U3 obtains pure 5V from 12V DC current and provides pure 5V to capacitor C13 and capacitor C14 for the working of the present invention; inductor L1 further suppresses power noises. Because the present invention uses only 5V for working, only a small electric current, about 10 ma, is consumed. Therefore, the aforesaid structure has a small size and consumes a small amount of power.

According to the present invention, in the electric energy measuring and converting circuit as shown in FIG. 3, capacitor C1 and capacitor C2 are power supply filters; capacitor C9 and capacitor C10 are reference voltage filters; IC chip U1 is the electric energy IC whose working frequency is obtained from the internal phase-lock loop of IC chip U4. The electric energy IC of IC chip U1 supplies signal and consumed current detection circuit and power voltage detection circuit subject to the working frequency obtained from the internal phase-lock loop of IC chip U4. The current and voltage input values are calculated by multiplication so that the electric energy IC of IC chip U1 outputs an electric pulse indicative of the current power value. The higher the power consumed, the greater the frequency of the electric energy will be. The output signal from the electric energy IC of IC chip U1 is provided to the microprocessor for calculation, so as to obtain the desired power and electric energy data.

The microprocessor proceeds with time counting process as well as electric energy correction, counting and storing processes. As shown in FIG. 3, IC chip U4 has built-in program to execute the designed processing processes; resistor R14 is for reset; capacitor C15 and capacitor C16 are power filters; Y1 is a 32.768 KHz quartz oscillator that forms with capacitor C17 and capacitor C18 an oscillation circuit. 32.768 KHz is the time counting base of the present invention. By means of the control of the internal phase-lock circuit of IC chip U4, the oscillation circuit provides a working frequency about 3 MHz to IC chip U4 and the electric energy measuring and converting circuit. Electric pulse signal is calculated by IC chip U4. Upon counting to a predetermined amount, a pulse signal PULSE is produced to drive on the light emitting diode D3 of the backlight warning circuit, i.e., the electric energy indicator LED. Each time 1 Wh is counted, the electric energy indicator LED is driven on once, i.e., IC chip U4 produces a pulse upon counting to "certain value", thereby driving on the light emitting diode D3 once. This "certain value" is the electric energy correction value. The electric energy correction value is obtained by comparing the auto calibration interface value of the auto power and electric energy calibration interface with the external standard electric meter. The electric energy correction value is used to calibrate the precision of the electric plug. The calculation and application of this electric energy correction value are the key technical point of the present invention that eliminates the use of any calibrating devices. This correction value is directly stored in the memory EEPROM of the microprocessor. Similarly, IC chip U4 adds 1 to the electric pulse calculation value per each second, the sum is multiplied by the power correction value and then divided by a constant to accurately obtain the consumed power, i.e., power value. The power correction value is obtained by comparing the auto calibration interface value of the auto power and electric energy calibration interface with the external standard power meter. This power correction value is used to calibrate the power precision of the electric plug. This power correction value is automatically produced without the use of any calibration devices.

Both the electric energy correction value and power correction value are directly stored in the memory EEPROM of IC chip U4.

The microprocessor has connected thereto an auto power and electric energy calibration interface. This calibration interface has two series ports electrically connected to an external calibration device for two-way auto-calibration communication. The auto power and electric energy calibration interface comprises two series signal interfaces TX and RX for in-factory auto-calibration two-way communication. The external calibration device is for interconnection with the auto power and electric energy calibration interface to provide the necessary test power supply and to read standard electric meter and power meter measuring data. During calibration, the external calibration device reads in the power and electric energy value from IC chip U4 through pin TX, compares the readings with the standard electric meter and power meter for calculation, and then sends the power correction value and electric energy correction value through pin RX to the memory EEPROM of IC chip U4. After several sends' time delay, the external calibration device reads in power and electric energy values of IC chip U4, and then compares the values with the standard meters for calculation, and then writes the correction values into the memory EEPROM. This procedure is repeated again and again until the power and electric energy values of IC chip U4 have reached the desired precision.

As shown in FIGS. 2 and 3, a load may be electrically connected to the electrode circuit of the electric plug of the present invention. The voltage for the load is the power voltage obtained through the power voltage detection circuit. The current for the load is obtained through the current detection circuit. Both the voltage and the current are sent to the electric energy IC to provide the desired power and electric energy data through a multiplication process.

Referring to FIG. 1 and FIGS. 4~6, the electric plug 1 may be provided with a power cable 2 for use as a power cable for an electric appliance (such as air-conditioner, refrigerator, etc.). After connection of the electric plug 1 to an electric socket, the LCD 3 displays the data of current watt number (w) being consumed, accumulative amount of electric energy (KWh), and other related electric data. The electric plug 1 may be used with an electric outlet having multiple electric sockets.

Referring to FIG. 3, the consumed current of the consumed current detection circuit all passes through R2 of which the impedance value is 1.0 mΩ. Therefore, the voltage drop across R2 is directly proportional to the consumed current, for example, when the consumed current is 1 A, the voltage drop is 1.0 mV (1.0 mΩ×1 A=1.0 mV). The maximum current is 20 A, and the corresponding voltage drop across R2 is 20 mV. The maximum consumption of power across R2 is 0.4 W. R2 is mounted on a PCB (printed circuit board) adjacent to the electrode circuit of the electric plug. Copper foil is used to transfer heat to the electric wire for dissipation. The size of R2 is very small, preventing accumulation of heat. If the electric plug is not properly connected, temperature resistor RT1 immediately detects the presence of abnormal heat, giving a warning signal.

The voltage detection circuit uses precision resistor to shunt the voltage, obtaining 1/300 of power voltage (R6 and R7 are connected in series to provide 150K+150K=300K; R5 is 1K). The invention is applicable to AC120V, maximum AC140V. Upon input of AC140V, the voltage at R5 is about 467 mV (140V/300=467 mV), i.e., the voltage at R5 is directly proportional to the power voltage applied.

The invention uses high precision quartz oscillator 32.768 KHz as the time base for counting the time of each 1-second precisely (32.768 KHz/$2^{15}$=1 Hz) and providing the precise frequency i.e., 32768×732=23986176 Hz according to the functioning of the internal phase-lock loop of the microprocessor. The microprocessor divides 23986176 Hz by 8 to obtain the necessary working frequency (3 MHz), which is also provided to the electric energy IC.

The electric energy IC used in the present invention has a high sensitivity that works upon a small amount of input current and input voltage. For example, the workable consumed current is within 0.04~20 A, i.e., 0.04 mV~20 mV, and workable power voltage is within 80V~140V, i.e., 267 mV~467 mV. According to the present preferred embodiment, under the conditions of 20 A load current and 140V consuming voltage and power factor 1.0 (PF=1.0 pure resistor) and frequency supply at 3 MHz, the outputted electric pulse from the electric energy IC is about 4666 Hz, and the actual power is 20 A×140V×1.0=2800 W, therefore the microprocessor U4 must make a calibration to obtain precise data.

According to the present invention, the microprocessor U4 is in charge of power calibration. It counts the electric pulse of the electric energy IC U2 based on the unit of 1-second. As stated above, under the conditions of 20 A and 140V and PF=1.0, the microprocessor counts to 4666 electric pulses per second. Comparing to the actual 2800 W, there is a big discrepancy. Therefore, an auto calibration is necessary, and the power correction value is obtained according to the following arithmetical expression (1):

Power correction value=actual power (W)×constant (1000)÷accumulative amount of pulses per second In the aforesaid equation, the constant is 1000, so that every calculated pulse represents 1 watt, which is the least power unit in the invention.

According to the above expression, the power correction value is:

2800×1000÷4666=600

The calculation of power value through the microprocessor is done through the following arithmetical expression (2):

Power value (W)=accumulative amount of electric pulses per second×power correction value÷constant (1000). When the power correction value 600 is substituted into the expression, i.e.:

Power value (W)=4666×600÷1000=2799.6≈2800 W

The result is close to the actual power 2800 W, i.e., by means of the power correction value (for example, 600) obtained through the auto calibration program, the invention achieves accurate power measuring function quickly and economically.

When starting electric energy (watt) calibration, the microprocessor U4 processes the electric pulse data from the electric energy IC U2 with a division calculation, i.e., the value is dived by the electric energy correction value and then counted. The invention uses Wh as the least unit for electric energy calibration and calculation. As stated above, under the conditions of 20 A and 140V and PF=1.0, the electric pulse of the electric energy IC is about 4666 signals per second, and 1 Wh=3600 watt-second, i.e., the microprocessor U4 drives the electric energy indicator LED to flash once each time 3600 watt-second electric energy has been counted. How many electric pulses should be counted to reach the aforesaid electric energy correction value, i.e., 1 Wh(3600 Ws)? The arithmetical expression (3) is as follows:

Electric energy correction value=3600 watt-second÷actual power×electric pulse frequency=3600÷2800×4666=5999 i.e., 1 Wh is reached each time the microprocessor U4 counted 5999 electric pulses, and 1 is added to the count, and at the same time the LED is driven to flash once. This is proved in the following expression. Under power consumption of 2800 W, there are 4666 electric pulses outputted per second. The amount of energy of each electric pulse is 2800 W/4666 Pulse=0.6 Ws/Pulse.

Therefore, when the counting reaches the electric energy correction value, i.e., 5999 electric pulses, the energy is: 0.6 Ws/Pulse×5999 pulses=3600 Ws, i.e., 1 Wh. Therefore, by means of the operation of the auto calibration program to compare to the external standard electric meter, the proper electric energy correction value (such as the aforesaid 5999) is obtained. Therefore, the invention achieves highly accurate electric meter function in the most efficient and economic way.

By means of the use of a special circuit structure and miniature components, the invention incorporates complicated power and electric energy detection and measuring circuits into an electric plug, which is as small as within 40 cubic centimeters. This high-precision and inexpensive electric plug is practical for a long use without producing much heat.

A prototype of electric plug has been constructed with the features of FIGS. 1~6. The electric plug functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electric plug comprising a housing and an electrode circuit, wherein said housing houses a detection circuit, an electric energy measuring and converting circuit, a DC power supply circuit, a microprocessor, and a liquid crystal display and drive circuit;

said detection circuit detects electric current and voltage, and removes high frequency noises from power supply;

said electric energy measuring and converting circuit receives detected signal from said detection circuit and outputs a corresponding electric energy signal to said microprocessor;

said DC power supply circuit provides the necessary working voltage to said electric energy measuring and converting circuit and said microprocessor;

said microprocessor proceeds with electric energy signal processing, time counting, and data storing processes according to the signal received;

said LCD circuit displays electric energy and time data;

said electrode circuit has an input end electrically connected to power supply and an output end electrically connected to an input end of said detection circuit; said detection circuit outputs an output signal through an output end thereof to an input end of said microprocessor; said microprocessor outputs processed time signal to said electric energy measuring and converting circuit and has an output end electrically connected to said LCD circuit; said DC power supply circuit has an input end electrically connected to said electrode circuit, a first output end electrically connected to said electric energy measuring and converting circuit, and a second output end electrically connected to said microprocessor.

2. The electric plug as claimed in claim 1, wherein said microprocessor has an electric energy indication and backlight warning circuit electrically connected to an output end thereof, said electric energy indication and backlight warning circuit being adapted to provide a backlight and to give an electric energy indication according to the outputted signal from said microprocessor.

3. The electric plug as claimed in claim 2, wherein said microprocessor has an operation key interface circuit electrically connected to an input end thereof for inputting of instructions to control display data.

4. The electric plug as claimed in claim 3, wherein said microprocessor comprises an auto power and electric energy calibration interface, said auto power and electric energy calibration interface having two series ports for connection to an external auto calibration apparatus for two-way communication.

5. The electric plug as claimed in claim 3, wherein a temperature detection circuit is electrically connected between said electrode circuit and an input end of said microprocessor, said temperature detection circuit comprising a thermistor (RT1) and a resistor (R13) connected in series to said thermistor (RT1), said temperature detection circuit detecting the voltage at the connection point between said thermistor (RT1) and said resistor (R13) and determining the temperature level according to the detected voltage level and then sending the detected temperature signal to said microprocessor, which in turn processes the temperature signal and drives said LCD circuit to give a warning signal when the temperature level of the temperature signal surpasses a predetermined range.

6. The electric plug as claimed in claim 3, wherein said detection circuit comprises a consumed current detection circuit, and a power voltage detection circuit connected in parallel to said consumed current detection circuit.

\* \* \* \* \*